US005658612A

United States Patent [19]

Li et al.

[11] Patent Number: 5,658,612

[45] Date of Patent: Aug. 19, 1997

[54] METHOD FOR MAKING A TANTALA/SILICA INTERFERENCE FILTER ON THE SURFACE OF A TUNGSTEN-HALOGEN INCANDESCENT LAMP

[75] Inventors: Hongwen Li, Pittsford, N.Y.; Keith A. Klinedinst, Marlboro, Mass.

[73] Assignee: Osram Sylvania Inc., Danvers, Mass.

[21] Appl. No.: 536,407

[22] Filed: Sep. 29, 1995

[51] Int. Cl.[6] .......................... C23C 16/40; C23C 16/56

[52] U.S. Cl. .......................... 427/107; 427/166; 427/167; 427/255; 427/255.3; 427/255.7; 427/376.2; 427/377; 427/378

[58] Field of Search .......................... 427/107, 161, 427/166, 167, 248.1, 255, 255.3, 255.7, 376.2, 377, 378; 313/112, 580

[56] References Cited

U.S. PATENT DOCUMENTS

| | | | |
|---|---|---|---|
| 3,666,534 | 5/1972 | Groth et al. | 117/97 |
| 4,239,811 | 12/1980 | Kemlage | 427/95 |
| 4,663,557 | 5/1987 | Martin, Jr. et al. | 313/112 |
| 4,775,203 | 10/1988 | Vakil et al. | 350/1.7 |
| 4,780,334 | 10/1988 | Ackerman | 427/248 |
| 4,949,005 | 8/1990 | Parham et al. | 313/112 |
| 4,983,001 | 1/1991 | Hagiuda et al. | 350/1.6 |
| 5,196,759 | 3/1993 | Parham et al. | 313/112 |
| 5,422,534 | 6/1995 | Dynys et al. | 313/112 |
| 5,438,012 | 8/1995 | Kamiyama | 437/60 |

*Primary Examiner*—Shrive Beck
*Assistant Examiner*—Timothy Meeks
*Attorney, Agent, or Firm*—Carlo S. Bessone

[57] ABSTRACT

A method for making a tantala/silica interference filter on the surface of a tungsten-halogen incandescent lamp having molybdenum leads includes depositing on the lamp surface by low pressure chemical vapor deposition the interference filter comprising alternating layers of tantala and silica. Thereafter, the filter is heat treated in an atmosphere of humidified inert gas containing less than 1% oxygen.

23 Claims, 3 Drawing Sheets

METHOD FOR MAKING A TANTALA/SILICA INTERFERENCE FILTER ON THE SURFACE OF A TUNGSTEN-HALOGEN INCANDESCENT LAMP

BACKGROUND OF THE INVENTION

1. Field of the invention

This invention relates to light interference filters for lamps, and is directed more particularly to a method for making tantala/silica interference filters on the surfaces of tungsten-halogen incandescent lamps having molybdenum lead wires.

2. Description of the Prior Art

Thin film optical coatings, known as interference filters, which comprise alternating layers of two or more materials of different indices of refraction, are well known to those skilled in the art. Such coatings, or films, are used to selectively reflect or transmit light radiation from various portions of the electromagnetic radiation spectrum, such as ultraviolet, visible and infrared radiation. The films or coatings are used in the lamp industry to coat reflectors and lamp envelopes. One application in which the thin film optical coatings are useful is to improve the illumination efficiency, or efficacy, of incandescent lamps by reflecting infrared energy emitted by a filament, or arc, back to the filament or arc while transmitting the visible light portion of the electromagnetic spectrum emitted by the filament. This lowers the amount of electrical energy required to be supplied to the filament to maintain its operating temperature. In other lamp applications, where it is desired to transmit infrared radiation, such filters reflect the shorter wavelength portions of the spectrum, such as ultraviolet and visible light portions emitted by the filament or arc, and transmit primarily the infrared portion in order to provide heat radiation with little or no visible light radiation. An application of this latter type includes a typical radiant heater, wherein visible radiation emitted by the heater is unwanted.

Such interference filters useful for applications where the filter will be exposed to high temperature in excess of 500° C., or so, have been made of alternating layers of tantala (tantalum pentoxide, $Ta_2O_5$) and silica ($SiO_2$) wherein the silica is the low refractive index material and the tantala is the high refractive index material. Such filters, and lamps employing same, are disclosed in U.S. Pat. Nos. 4,588,923; 4,663,557 and 4,689,519. In such lamp applications, the interference filters, which are applied on the outside surface of the vitreous lamp envelope containing the filament within, often reach operating temperatures of about 800° C. These interference filters, or coatings, have been applied primarily using evaporation or sputtering techniques which, while capable of producing a satisfactory interference filter, have limitations with respect to difficulty in applying a uniform coating to any but a flat surface. Tubing used for making lamps, must be rotated in the sputtering or vacuum evaporation chamber as the coating is being applied. This technique does not lend itself to the application of uniform coatings, and is rather costly.

In U.S. Pat. No. 4,949,005, issued Aug. 14, 1990, in the name of Thomas G. Parham, et al, there is described a method for the manufacture of thin film interference filters consisting of alternating layers of tantala and silica suitable for high temperature use on electric lamps. Depending upon the individual layer thicknesses, such filters may be designed to reflect light with wavelengths falling within a particular range, while transmitting light of other wavelengths. As described in the '005 patent, one use for such thin film interference filters is as coatings on vitreous envelopes of incandescent lamps, which coatings improve lamp efficiency by reflecting infrared energy emitted by the lamp filament back onto the filament, while transmitting visible light emitted by the filament. The method for the manufacture of such multilayer coatings described in '005 patent essentially involves depositing alternating layers of tantala and silica upon the surface of the lamp by low pressure chemical vapor deposition. In order to avoid the development of catastrophic stresses when the coated lamps are subsequently burned, leading to poor adhesion and poor optical properties, the coated lamps are heat treated to a temperature at least as high as the temperature of the lamp surface when the lamp is burned. Moreover, during this heat treatment process, the temperature of the coated lamp is maintained between 550° and 675° C. for a period of time ranging between 0.5 hour and 5 hours before being exposed to the higher lamp burning temperature, to control the rate of formation and growth of tantala crystallites during the heat treatment. The higher temperature is applied for 0.1–5 hours, and is at least as high as the lamp surface when the lamp is burned. During the heat treatment process, a pattern of fine randomly oriented cracks develops, resulting in a decrease in the overall, or average, stress. Random cracking is a natural consequence of high stresses in thin films. The heat treatment allows cracked coatings to remain stable during lamp operation.

However, a particularly serious problem arises during heat treatment of the aforesaid filters on tungsten-halogen lamps. The external electrical current leads of such lamps typically are of molybdenum wire, the wires being molded to small pieces of molybdenum foil hermetically sealed and embedded within a pressed seal portion of the lamp. Because molybdenum is an easily oxidized metal, it tends to react with oxygen contained in the heat-treatment atmosphere. Volatile molybdenum oxides are formed on the lead wires, reducing the lead wire diameter and allowing oxygen to diffuse through the pressed seal, weakening or destroying the hermeticity of the seal. Accordingly, from the standpoint of lead wire and pressed seal integrity, the tantala-silica multilayer filter should be heat treated in an atmosphere of inert gas containing little or no oxygen.

The use of a heat-treatment atmosphere consisting of an inert gas, such as nitrogen or argon, with little or no oxygen content, results in a coating which, upon inspection, appears brown due to the absorption of visible light. This broad-band visible absorption is believed to result primarily from the pyrolysis of organic residues originating from the organometallic precursors used in the low pressure chemical vapor deposition multilayer process. If the heat-treatment atmosphere contains a significant amount of oxygen (>2%, by volume), these trapped organic residues are apparently oxidized and eliminated via diffusion, producing heat-treated coatings which absorb very little of the incident visible light.

There exists, then, a problem in the heat treatment of typical tungsten-halogen lamps with envelopes coated with tantala/silica multilayer interference filters applied according to the method of Parham, et al. In particular, coatings designed to transmit visible light must be heat treated to approximately 800° C. in an atmosphere containing at least 2% oxygen in order to produce thermally stabilized coatings with low absorption coefficients for visible light. On the other hand, heat-treatment atmospheres containing little or no oxygen must be used in order to avoid massive oxidation of the molybdenum current leads and, ultimately, destruction of the hermetic pressed-glass seals.

There is thus a need for an improved method for making a thin film interference filter on the surface of tungsten-halogen lamps, which method will permit heat treatment of the filter to temperatures of around 800° C., without coloration of the filter and without significant oxidation of the molybdenum lead wires.

SUMMARY OF THE INVENTION

It therefore is an object of the invention to provide a method for making a tantala/silica interference filter including heat treating of the filter to a temperature of about 800° C., without coloration of the filter and without significant oxidation of the molybdenum lead wires.

With the above and other objects in view, as will hereinafter appear, a feature of the present invention is the provision of a method for making a tantala/silica interference filter on the surface of a tungsten-halogen incandescent lamp having molybdenum leads. In accordance with the novel method, there is deposited on the lamp surface by low pressure chemical vapor deposition the interference filter comprising alternating layers of tantala and silica. Thereafter, the filter is heat treated in an atmosphere of humidified inert gas containing less than 1% oxygen (by volume).

The above and other features of the invention, including various novel details of construction and combinations of parts, will now be more particularly described with reference to the accompanying drawings and pointed out in the claims. It will be understood that the particular method embodying the invention is shown by way of illustration only and not as a limitation of the invention. The principles and features of the invention may be employed in various and numerous embodiments without departing from the scope of the invention.

BRIEF DESCRIPTION OF THE DRAWINGS

Reference is made to the accompanying drawings in which is shown an illustrative embodiment of the invention, from which its novel features and advantages will be apparent.

In the drawings.

DESCRIPTION OF THE PREFERRED EMBODIMENT

Figure 1:
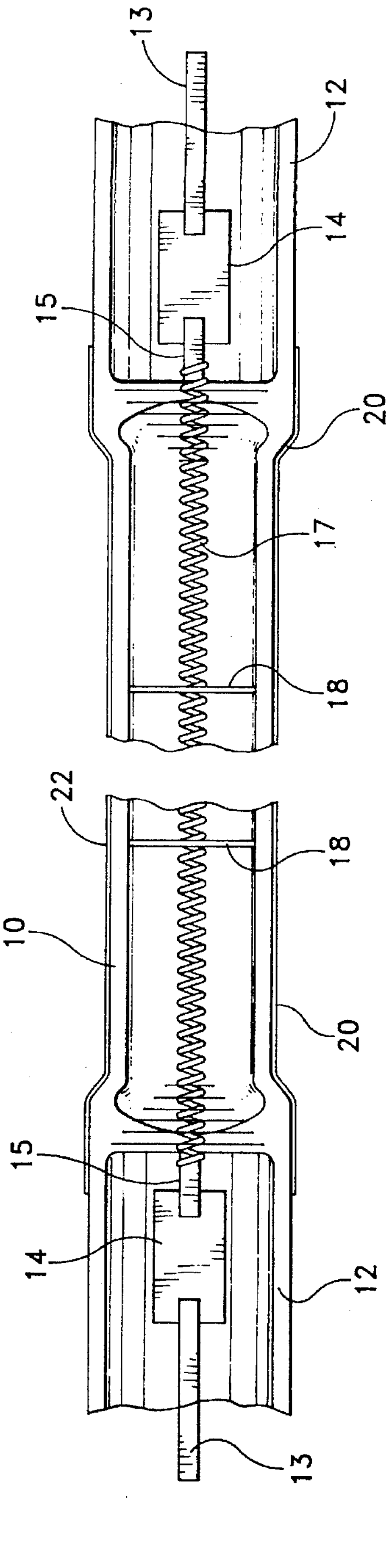
FIG. 1 (PRIOR ART)
FIG. 1 is a side elevational view of a lamp of the type in which the present invention finds utility.
Figure 2B:
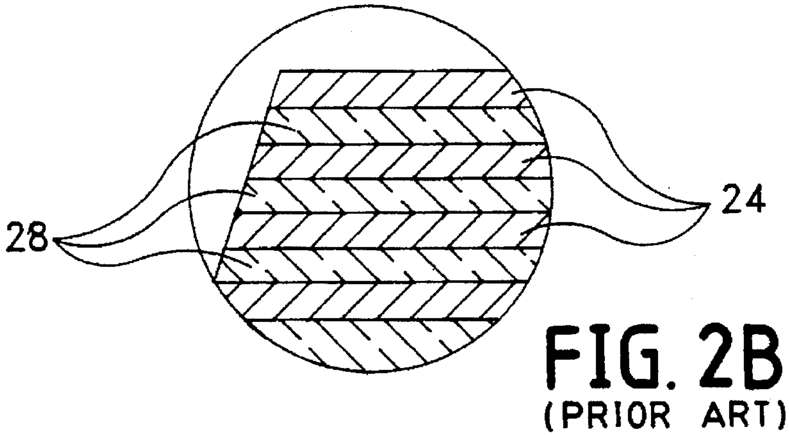
FIG. 2B (PRIOR ART)
FIG. 2B is a magnified portion of the interference filter of FIG. 2A.
Figure 2A:
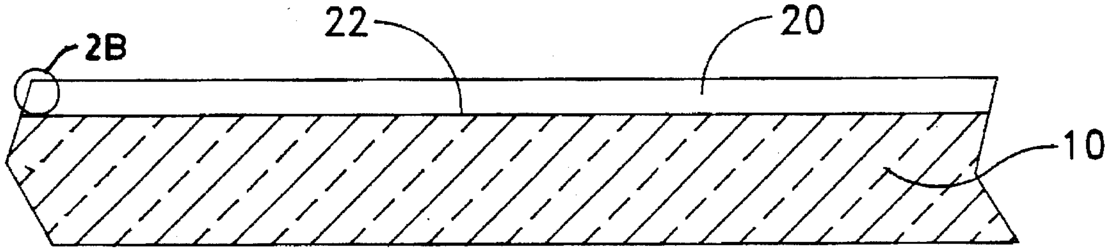
FIG. 2A (PRIOR ART)
FIG. 2A is an enlarged diagrammatic view of a portion of the lamp of FIG. 1, including an interference filter on a surface of the lamp envelope.
Figure 3:
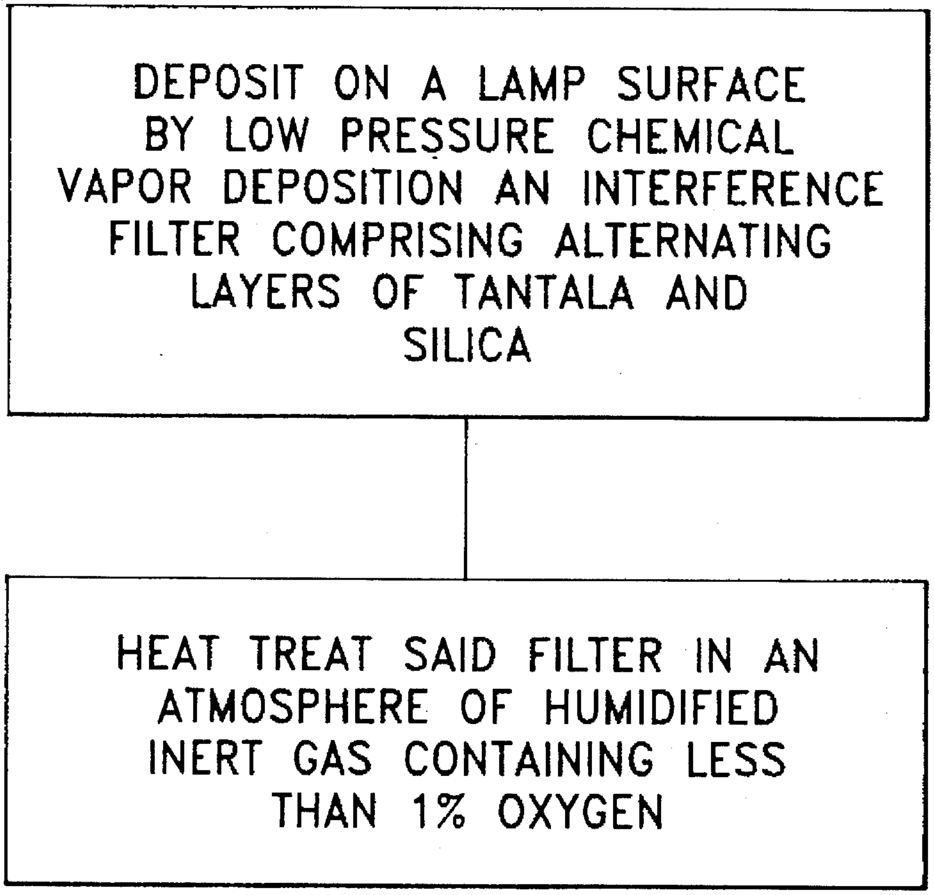
FIG. 3 is a block diagram setting forth an illustrative embodiment of the inventive method.

Referring to FIG. 1, there is illustrated an incandescent lamp of the type to which the present invention is directed. The lamp includes an envelope 10 made of a vitreous light emissive quartz silica capable of withstanding high temperatures of about 800° C. Each end of the envelope 10 is provided with a pressed seal portion 12 in which is sealed a lead wire 13 electrically and mechanically connected to a molybdenum foil 14, which is hermetically sealed and embedded in the seal portion 12 of the lamp. Leads 15, made of a suitable refractory metal, such as molybdenum or tungsten, are attached to the other end of the molybdenum foils 14 and are further connected to a tungsten filament 17 which is supported on its axis within the envelope 10 by suitable supporting membranes 18. A thin film optical interference filter 20 (FIGS. 2A and 2B) is disposed on the outer surface 22 of the lamp envelope 10 as a continuous coating of alternating layers of tantala 24 and silica 28.

According to the invention, the tantala/silica multilayer interference filter 20, deposited by low pressure chemical vapor deposition using organometallic precursors, is heat treated to temperatures as high as 800° C. in an atmosphere of inert gas (such as $N_2$ or Ar) containing less than 1% oxygen (by volume), which has been humidified to contain a concentration of moisture of between 0.5% and 5% (by volume). Such humidification of the coated-lamp heat-treatment environment has a very beneficial result. Specifically, tantala/silica interference filters that are heat-treated in humidified inert gas containing less than 1.0% oxygen have visible light absorbencies no greater than those of comparable filters heat-treated in a non-humidified atmosphere containing at least 2% oxygen. The presence of moisture within the heat-treatment atmosphere is believed to facilitate the oxidation/removal of organic residues that remain within the coating at the completion of the low pressure chemical vapor deposition process. Moreover, such humidification of the heat-treatment atmosphere does not increase the rate at which the molybdenum electric leads of a coated quartz-halogen lamp are oxidized during the heat treatment process. Thus, by the use of humidified heat-treatment atmospheres containing less than 1.0% oxygen, tantala/silica multilayer interference filters prepared as described by Parham, et al, on the quartz envelopes of tungsten/halogen lamps, can be thermally stabilized by heating to temperatures in the vicinity of 800° C. without significant oxidation of the molybdenum lead wires. The resulting thermally stabilized coatings have visible light absorbencies that are no greater than are those of similarly deposited tantala/silica coatings heat treated in a non-humidified atmosphere containing at least 2% oxygen.

EXAMPLE

The following example is provided to illustrated the improved process described above. A 37-layer tantala/silica interference filter designed to transmit visible light, with an approximate 3 micron total thickness, was deposited by low pressure chemical vapor deposition upon the surfaces of a number of tungsten-halogen lamps with fused-silica envelopes and molybdenum current leads. Tantalum ethoxide and diacetoxydi-t-butoxysilane were used as the chemical precursors for the high and low index coating materials, respectively, with a deposition temperature of about 465° C. The alternating layers were applied, one after the other, until the complete 37-layer filter was deposited. Then, the deposition chamber was allowed to cool, and the coated lamps were removed and transferred to a separate heat-treatment chamber at ambient temperature.

The coated lamps were then divided into three groups, and each group was subjected to the following heat treatment cycle: heat rapidly to 500° C., then, heat at 1°/min to 650° C. and hold for 3 hours; then, heat at 1°/min to 800° C. and hold for 1 hr; then, cool to room temperature at 2°–3°/min. However, a different heat-treatment environment was used with each of the three groups of lamps. In each case, the heat treatment gas, which was composed mainly of nitrogen, flowed through the heat treatment chamber at an approximate 1 lpm rate. With one group of lamps, the flowing gas stream contained 0.5% oxygen. With a second group of lamps, the heat-treatment environment contained 2.0% oxygen. The remaining group of lamps was heat treated in a stream of nitrogen containing 0.5% oxygen which was passed through a water filled bubbler maintained at ambient temperature prior to entering the heat-treatment chamber, resulting in an approximate 2.5% water concentration within the flowing gas stream. The heat-treated coatings were all cracked but remained firmly attached to the quartz lamp envelopes. Moreover, the coatings all remained firmly bonded to the lamp surfaces after the coated lamps were burned at 120 V for approximately 200 hours.

Each set of coated and heat-treated lamps were then examined visually, microscopically, and spectroscopically to gauge the effect of the heat-treatment upon both the tantala/silica interference filter and the molybdenum current leads. The coated lamps heat treated in an atmosphere containing only 0.5% oxygen appeared to possess a brown coloration when observed under a strong light. In contrast, the coated lamps heat treated in an atmosphere containing 2.0% oxygen or in a humidified atmosphere containing only 0.5% oxygen appeared colorless when similarly illuminated. Representative lamps heat treated in each of the three atmospheres were then cut open and disassembled, and the relative transmission of visible light in the 500–650 nm wavelength range was determined spectroscopically for a section of each coated and heat-treated quartz lamp envelope. The results of these measurements are listed in Table 1. As indicated, the transmission of visible light through the tantala/silica multilayer coatings heat-treated in an atmosphere containing only 0.5% oxygen was found to be about 15% lower than that for the coatings heat-treated either in 2.0% oxygen or in the humidified atmosphere containing 0.5% oxygen.

TABLE I

| Gas Composition | Normalized Transmission (500–640 nm) | Color |
|---|---|---|
| 0.5% $0_2$ | 0.85 | Brown |
| 0.5% $0_2$ + 2.5% $H_20$ | 1.01 | Colorless |
| 2.0% $0_2$ | 1.00 | Colorless |

The molybdenum current leads were examined for each set of coated and heat treated lamps. For the lamps heat-treated in an atmosphere containing 2.0% oxygen, the molybdenum leads were obviously severely oxidized. The leads were reduced in size, and their surfaces appeared badly pitted when examined microscopically. In contrast, the molybdenum leads on the coated lamps heat-treated in either humidified or non-humidified nitrogen containing 0.5% oxygen had been much less aggressively attacked. Microscopic examination showed much less surface pitting and, as indicated in Table II, a relatively minor reduction in size.

TABLE II

| Gas Composition | Reduction in Diameter of Molybdenum Leads (%) |
|---|---|
| 0.5% $0_2$ | 7 |
| 0.5% $0_2$ + 2.5% $H_20$ | 7 |
| 2.0% $0_2$ | 23 |

Thus, tantala/silica interference filters that are heat treated in humidified inert gas containing no more than 0.5% oxygen absorb no more visible light than do comparable filters heat treated in a non-humidified atmosphere containing at least 2% oxygen. Moreover, such humidification of the heat-treatment atmosphere does not increase the rate at which the molybdenum current leads of a quartz-halogen lamp are oxidized during the heat-treatment process. Accordingly, by the use of humidified heat-treatment atmospheres containing less than 1.0% oxygen, tantala/silica multilayer interference filters prepared as described by Parham, et al, on the quartz envelopes of tungsten/halogen lamps, can be thermally stabilized by heating to temperatures in the vicinity of 800° C. without significant oxidation of the molybdenum lead wires. The viable-light absorbencies of the resulting thermally stabilized coatings are no greater than are those of similarly deposited tantala/silica multilayer coatings heat treated in a non-humidified atmosphere containing at least 2% oxygen.

It is to be understood that the present invention is by no means limited to the particular construction herein disclosed and/or shown in the drawings, but also comprises any modifications or equivalents within the scope of the claims. For example, the method described herein can be used to provide interference filters for tungsten/halogen lamps having envelopes formed from other than fused silica, including "hard-glass" envelopes.

Having thus described our invention, what we claim as new and desire to secure by Letters Patent of the United States is:

1. Method for making a tantala/silica interference filter on a surface of a tungsten-halogen incandescent lamp having molybdenum leads, said method comprising the steps of:

depositing on the lamp surface by low pressure chemical vapor deposition the interference filter comprising alternating layers of tantala and silica; and heat treating said filter in an atmosphere of humidified inert gas having a concentration of moisture of 0.5%–5.0% and containing less than 1% oxygen.

2. The method in accordance with claim 1 wherein organometallic precursors are used in the deposition of the tantala and silica layers.

3. The method in accordance with claim 2 wherein said precursors comprise tantalum ethoxide and diacetoxydi-t-butoxysilane for the tantalum and silica layers, respectively.

4. The method in accordance with claim 3 wherein said deposition is carried out at a temperature of about 465° C.

5. The method in accordance with claim 4 wherein said alternating layers comprise 37 layers.

6. The method in accordance with claim 4 wherein said deposition is carried out in a deposition chamber and wherein after said deposition said deposition chamber is allowed to cool to substantially ambient temperature and wherein said lamp is thereafter transferred at substantially ambient temperature to a heat-treatment chamber for said heat treating.

7. The method in accordance with claim 1 wherein said heat treating is carried out at temperatures up to about 800° C.

8. The method in accordance with claim 7 wherein said heat treating comprises:

heating said filter to about 500° C.;

heating said filter from about 500° C. at temperatures increasing about 1° C. per minute to about 650° C.;

heating said filter at about 650° C. for about 3 hours;

heating said filter from about 650° C. at temperatures increasing about 1° C. per minute to about 800° C.;

heating said filter at about 800° C. for about 1 hour; and cooling said filter to ambient temperature at about 2°–3° C. per minute.

9. The method in accordance with claim 7 wherein said heat treating is carried out in a heat treatment chamber and said inert gas is flowed through said heat treatment chamber during said heat treating at a rate of about 1 liter per minute.

10. The method in accordance with claim 1 wherein said inert gas is selected from the group consisting of nitrogen and argon.

11. The method in accordance with claim 1 wherein said inert gas contains no more than 0.5% oxygen.

12. The method in accordance with claim 1 wherein said deposition is carried out in a deposition chamber and said heat treating is carried out in a heat-treatment chamber, and wherein after said deposition said deposition chamber is allowed to cool to substantially ambient temperature and wherein said lamp is thereafter transferred to said heat-treatment chamber which is at substantially ambient temperature.

13. The method in accordance with claim 12 wherein said inert gas is flowed through said heat-treatment chamber during said heat-treating.

14. The method in accordance with claim 13 wherein said inert gas contains no more than 0.5% oxygen.

15. The method in accordance with claim 14 wherein said inert gas flowed through said heat-treatment chamber contains a concentration of moisture of about 2.5%.

16. The method in accordance with claim 13 wherein said inert gas is passed through a water-filled bubbler prior to entering said heat-treatment chamber.

17. The method in accordance with claim 16 wherein said bubbler water is at ambient temperature.

18. The method in accordance with claim 16 wherein said inert gas is selected from the group consisting of nitrogen and argon.

19. The method in accordance with claim 16 wherein said inert gas is nitrogen.

20. The method in accordance with claim 12 wherein said deposition is carried out at a temperature of about 465° C. and said heat-treating is carried out at temperatures up to about 800° C.

21. The method in accordance with claim 1 wherein said inert gas is flowed through a heat-treatment chamber in which said heat treating is effected.

22. The method in accordance with claim 21 wherein said inert gas is passed through a water-filled bubbler prior to entering said heat-treatment chamber.

23. The method in accordance with claim 1 wherein said inert gas contains a concentration of moisture of about 2.5%.

* * * * *